United States Patent
Mittl et al.

(10) Patent No.: US 9,310,418 B2
(45) Date of Patent: Apr. 12, 2016

(54) CORRECTION FOR STRESS INDUCED LEAKAGE CURRENT IN DIELECTRIC RELIABILITY EVALUATIONS

(71) Applicant: International Business Machines Corporation, Armonk, NY (US)

(72) Inventors: Steven W. Mittl, Essex Junction, VT (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/535,678

(22) Filed: Nov. 7, 2014

(65) Prior Publication Data
US 2015/0061724 A1    Mar. 5, 2015

Related U.S. Application Data

(62) Division of application No. 13/117,819, filed on May 27, 2011, now Pat. No. 8,937,487.

(51) Int. Cl.
  *G01R 31/02* (2006.01)
  *G01R 31/12* (2006.01)
  *G06F 19/00* (2011.01)
  *G01R 31/26* (2014.01)

(52) U.S. Cl.
  CPC ............... *G01R 31/12* (2013.01); *G01R 31/26* (2013.01); *G01R 31/2642* (2013.01); *G06F 19/00* (2013.01); *G01R 31/2621* (2013.01)

(58) Field of Classification Search
  CPC .... G01R 31/12; G01R 31/26; G01R 31/2642; G06F 19/00
  See application file for complete search history.

(56) References Cited

U.S. PATENT DOCUMENTS

| | | | |
|---|---|---|---|
| 4,686,857 A | 8/1987 | Kato | |
| 6,043,102 A | 3/2000 | Fang et al. | |
| 6,173,235 B1 | 1/2001 | Maeda | |
| 6,269,315 B1 | 7/2001 | Fu et al. | |
| 6,326,792 B1 | 12/2001 | Okada | |
| 6,538,462 B1 | 3/2003 | Lagowski et al. | |
| 7,737,717 B2 | 6/2010 | Nicollian et al. | |
| 7,751,995 B2 | 7/2010 | Kim | |
| 2011/0199093 A1 | 8/2011 | Fujisawa | |

OTHER PUBLICATIONS

Hauser, Numerical Methods for Nonlinear Engineering Models, Springer Science & Business Media, 2009, p. 310.*
USPTO, Notice of Allowance issued in U.S. Appl. No. 13/117,819 dated Sep. 15, 2014.
USPTO, Office Action issued in U.S. Appl. No. 13/117,819 dated Apr. 18, 2014.
Wu, et al., "A Viable and Comprehensive TDDB Assessment Methodology for Investigation of SRAM vmin Failure", Electron Devices Meeting (IEDM), 2009 IEEE International Electron Devices Meeting.
Nigam, et al., "Constant Current Charge-to-breakdown: still a valid tool to study the reliability of MOS structures?" 36th Annual Reliability Physics Symposium Proceedings, 1998 IEEE International.
Sune, et al., "Breakdown statistics of gate dielectric stacks", China Semiconductor Technology International Conference, SEMICON China 2010.
Sune, et al., "Defects Associated with Dielectric Breakdown in SiO-Based Gate Dielectrics", Chapter 16, Edited by Daniel M . Fleetwood , Sokrates T . Pantelides , and Ronald D . Schrimpf CRC Press 2008.

* cited by examiner

*Primary Examiner* — Daniel Miller
(74) *Attorney, Agent, or Firm* — Thompson Hine LLP; Steven J. Meyers

(57) ABSTRACT

Methods, apparatus, and computer program products for evaluating current transients measured during an electrical stress evaluation of a dielectric layer in a semiconductor device. Measured current transients are fit to an equation representing a time dependence for stress induced leakage currents. The measured current transients are corrected based upon stress currents computed from the equation to define corrected current transients.

22 Claims, 5 Drawing Sheets

CORRECTION FOR STRESS INDUCED LEAKAGE CURRENT IN DIELECTRIC RELIABILITY EVALUATIONS

BACKGROUND

The invention relates generally to semiconductor device fabrication and, in particular, to system, methods, and computer program products for evaluating the time-dependent dielectric breakdown of a dielectric layer in a semiconductor device, such as the gate dielectric layer of a metal-oxide-semiconductor field-effect transistor (MOSFET).

Time-dependent dielectric breakdown (TDDB) is a progressive failure mechanism observed in semiconductor devices, such as metal-oxide-semiconductor field-effect transistors. TDDB occurs over time and may eventually cause the gate dielectric layer to break down from the extended application of a voltage during operation. When a MOSFET is operated for lengthy periods at normal supply voltages, the gate leakage current increases gradually as defects are accumulated in the gate dielectric layer. This process ultimately leads to device breakdown as TDDB may eventually form a conducting path through the gate oxide to the substrate. Essentially, the electrical insulating properties of the gate dielectric layer may be lost, which causes the gate and the channel region to become electrically shorted and leads to the failure of the MOSFET.

Reliability tests are routinely used to estimate an expected lifetime of a gate dielectric layer so that device performance can be guaranteed to remain within the device's specification for a determined period of time. Under operating conditions with normal supply voltages biasing the gate, reliability testing would take an impractically long period of time. Consequently, reliability testing is usually performed by applying excess electrical stress in the form of voltage and/or current on the gate dielectric layer. The stress promotes the faster accumulation of defects, which accelerates the breakdown of the gate dielectric layer. The breakdown may be further accelerated by testing at elevated temperatures. The lifetime of a gate dielectric layer under operating conditions can then be determined from an extrapolation of the results of reliability testing.

Improved methods of reliability testing, apparatus for reliability testing, and computer program products are needed.

SUMMARY

In an embodiment of the invention, a method is provided for evaluating current transients measured during an electrical stress evaluation of a dielectric layer in a semiconductor device. The method includes fitting the measured current transients to an equation representing a time dependence for stress induced leakage currents. The method further includes correcting the measured current transients based upon stress currents computed from the equation to define corrected current transients.

In an embodiment of the invention, an apparatus includes a processor and program code configured to be executed by the processor for evaluating current transients measured during an electrical stress evaluation of a dielectric layer in a semiconductor device, the program code configured to fit the measured current transients to an equation representing a time dependence for stress induced leakage currents, and to correct the measured current transients based upon stress currents computed from the equation to define corrected current transients.

In an embodiment of the invention, a computer program product is provided for evaluating current transients measured during an electrical stress evaluation of a dielectric layer in a semiconductor device. The computer program product includes a computer readable storage medium having computer readable program code embodied therewith. The computer readable program code comprises computer readable program code configured to fit the measured current transients to an equation representing a time dependence for stress induced leakage currents, and to correct the measured current transients based upon stress currents computed from the equation to define corrected current transients.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention relate to methods and systems for evaluating the reliability of a semiconductor device. More particularly, the methods and systems may be used to evaluate the time-dependent dielectric breakdown (TDDB) of a dielectric layer in a semiconductor device, such as the TDDB of a gate dielectric layer in a metal-oxide-semiconductor field-effect transistor. More specifically, the electrical stress evaluations may be performed with the field-effect transistors heated above room temperature and the field-effect transistors may include gate dielectric layers that are comprised of a single layer of a dielectric material or comprised of a dual layer film, such as a silicon dioxide ($SiO_2$) interfacial layer and a layer of a high-k dielectric material. For high-k dielectric films, positive bias temperature instabilities in an n-channel field effect transistor (nFET) or negative bias temperature instabilities in a p-channel field effect transistor (pFET) may cause SILC to rise rapidly as the reliability testing temperature is increased to accelerate the device testing.

Stress-induced leakage current (SILC) effects, which occur during the electrical stress evaluations of gate dielectric layers, may obscure and interfere with the detection of gate dielectric failure. The measurements of stress or gate current may be corrected to remove the effects of SILC to improve the accuracy of TDDB evaluations. Specifically, the accuracy of TDDB evaluations may be improved by removing the interference of SILC with the detection of dielectric failure. By removing the effects of SILC, TDDB evaluations may be performed at low voltages and high temperatures, which is consistent with normal device operation of most semiconductor devices. Conventional restrictions on TBBD that required testing at low temperatures and high voltages, which is directly contrary to normal device operation, are eliminated by practicing the embodiments of the invention.

Figure 1:
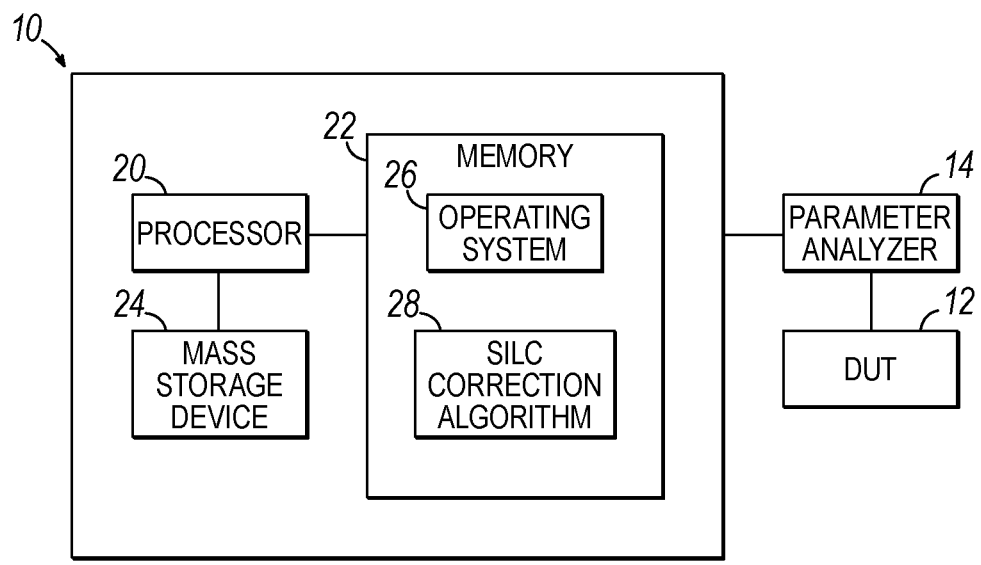
FIG. 1 is diagrammatic view of a system for TDDB testing and analyzing the results of the TDDB testing to correct for the SILC contribution.

With reference to FIG. 1 and in accordance with an embodiment of the invention, a system 10 is used to analyze current transients in a TDDB test performed at constant voltage for a device under testing (DUT) 12. In one embodiment, the DUT 12 may include a group of field-effect transistors connected in parallel. Each field-effect transistor in the DUT 12 is characterized by a gate structure formed on a top surface of a substrate, a source and a drain formed in the substrate, and a planar channel region in the substrate. The gate structure includes a gate dielectric layer and a gate electrode. In a planar device architecture, the gate structure overlies the planar channel region, which is laterally disposed between the source and drain. Each field-effect transistor may be formed by a metal-oxide-semiconductor (MOS) process, which is understood by a person having ordinary skill in the art, and all of the parallel-connected field-effect transistors may be either nFETs or pFETs. The number of field-effect transistors connected in parallel to form the DUT 12 may vary, but may range for example from five (5) discrete devices to one hundred (100) or more discrete devices. The gate structure of each of the field-effect transistors has an area given by a gate length and a gate width. Typically, all of the field-effect transistors in the DUT 12 will have the same gate length and gate width.

The gate dielectric layer of the gate structure for each field-effect transistor in the DUT 12 may be comprised of an insulating material (e.g., a non-conductor). In one embodiment, the gate dielectric layer may include one or more layers of a dielectric material having a dielectric constant (e.g., a permittivity) characteristic of a high-k dielectric. In another embodiment, the gate dielectric layer may include a dual layer film, such as an interfacial layer of a material (e.g., $SiO_2$) with a dielectric constant less than 10 and a layer of a high-k dielectric material. As used herein, candidate high-k dielectric materials may have a dielectric constant greater than 10 and, preferably, in a range of 10 to 100. Representative high-k dielectric materials include, but are not limited to, hafnium-based dielectric materials like hafnium oxide ($HfO_2$), hafnium silicate (HfSiO), or a nitrided hafnium silicate (HfSiON), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. The dielectric materials may be deposited by atomic layer deposition (ALD), chemical vapor deposition (CVD), or another conventional deposition technique.

The gate of the gate structure for each field-effect transistor in the DUT 12 may include one or more layers comprised of a conductor, such as doped polycrystalline silicon (polysilicon) and/or a metal. In various embodiments, the metal contained in the gate may be a layer of a material comprised of tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, or analogous materials recognized by a person having ordinary skill in the art. The gate may be deposited by CVD, ALD, physical vapor deposition (PVD), etc.

The system 10 is coupled with, or may include, a semiconductor parameter analyzer 14, which is utilized to apply constant stress voltage to the DUT 12. Specifically, the constant stress voltage is applied to the gates and gate dielectrics in the gate stack of each field-effect transistor in the DUT 12 and each source, drain, and substrate are grounded. The semiconductor parameter analyzer 14 measures the current transient by applying constant voltage to the gates of the parallel-connected field-effect transistors in the DUT 12 to establish a continuous electrical stress in the form of an electric field across the respective gate dielectric layers. The gate current is monitored and sampled by the semiconductor parameter analyzer 14. In order to reduce the measurement time, the gate dielectric layer of the field-effect transistors in the DUT 12 may be held at an elevated temperature during the measurement of the current transients by the semiconductor parameter analyzer 14. For example, the temperature may be held at 125° C. during the current transient measurement and the gate voltage may be fixed at a value within a range of 2.2 volts to 2.35 volts.

Figure 2:
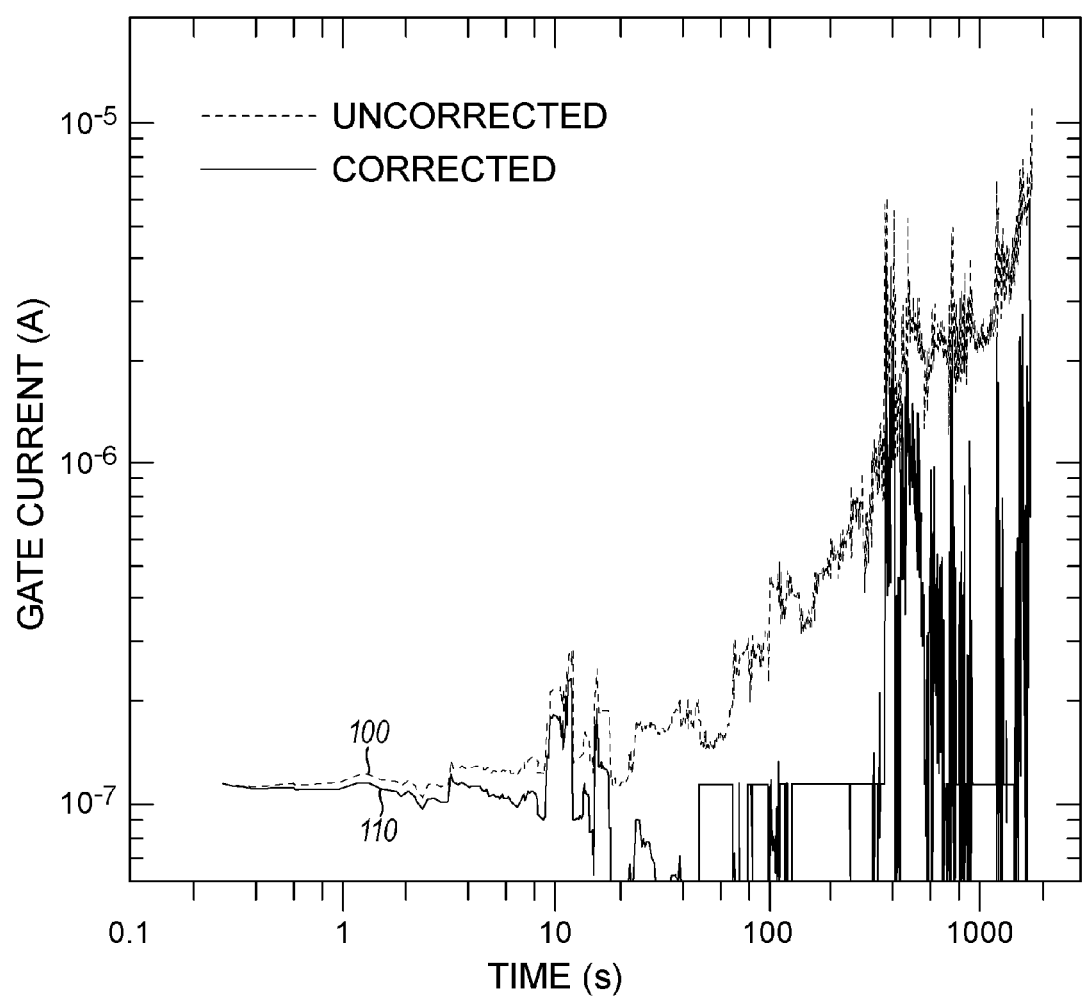
FIG. 2 is a current-time trace before and after correction of the data points to remove the SILC contribution.

With reference to FIG. 2, the stress currents of the DUT 12 subjected to electrical stress testing by the semiconductor parameter analyzer 14 (FIG. 1) are plotted as a function of measurement time to generate a current-time trace 100. The data shown in the current-time trace 100 represent transient currents (i.e., stress currents or gate currents) that vary in magnitude with time in response to the electrical stress applied by the semiconductor parameter analyzer 14 to the DUT 12. At early measurement times, the stress currents in current-time trace 100 exhibits little change with increasing time. As the stress continues, the stress currents in the current-time trace 100 increase rapidly by up to one order of magnitude or more and many of the field-effect transistors the DUT 12 exhibit hard breakdown as evidenced by sharp current jumps or spikes in the transient current. Each spike in the transient stress current hard originates from the breakdown of an individual field-effect transistor in the DUT 12.

The current-time trace 100 also contains a SILC component superimposed upon the stress current spikes. The SILC component increases in significance with increasing measurement times. As a result, the comparatively large SILC increase observed in the current-time trace 100 interferes with the experimental characterization of transient currents by increasing the difficulty in separating different current components, such as background tunnelling currents through the gate dielectric layer, the SILC component, the current associated with percolation path formation in the gate dielectric layer that leads to the initial breakdown (BD) event in each of the field-effect transistors, and the post-breakdown current of each field-effect transistor after the initial breakdown event.

With renewed reference to FIG. 1, the system 10 further includes at least one processor 20 selected from controllers, microprocessors, micro-controllers, microcomputers, digital signal processors, central processing units, field programmable gate arrays, programmable logic devices, state machines, logic circuits, analog circuits, digital circuits, and/or any other devices that manipulate signals (analog and/or digital) based on operational instructions that are stored in a memory 22. The memory 22 may be a single memory device or a plurality of memory devices including but not limited to random access memory (RAM), volatile memory, non-volatile memory, static random access memory (SRAM), dynamic random access memory (DRAM), flash memory, cache memory, and/or any other device capable of storing digital information. The system 10 includes a mass storage device 24 may include one or more hard disk drives, floppy or other removable disk drives, direct access storage devices (DASD), optical drives (e.g., a CD drive, a DVD drive, etc.), and/or tape drives, among others.

Figure 5:
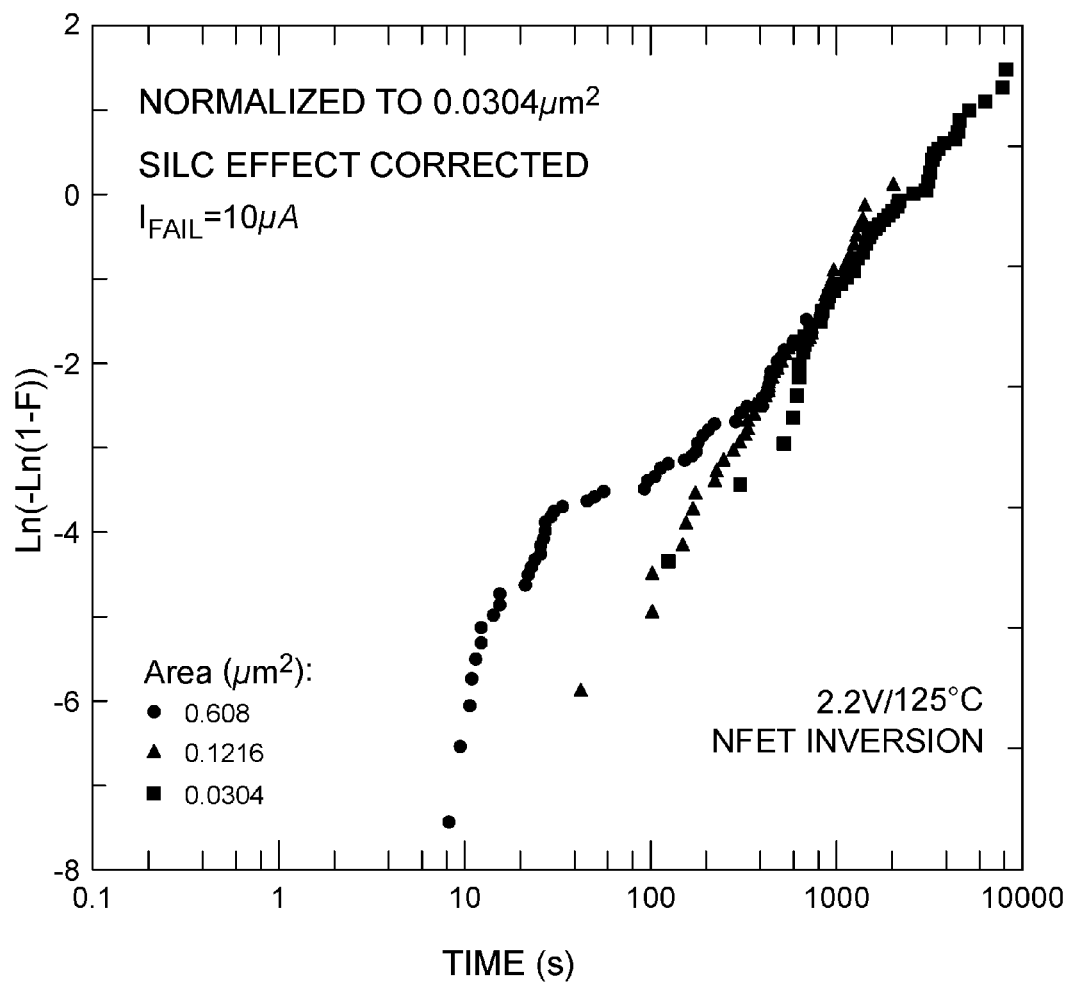
FIG. 5 is a graph showing the cumulative breakdown distribution, F, of FIG. 4 after SILC correction and following Poisson area scaling.

The processor 20 operates under the control of an operating system 26, and executes or otherwise relies upon computer program code embodied in various computer software applications, components, programs, objects, modules, data structures, etc. The computer program code residing in memory 22 and stored in the mass storage device 24 also includes a SILC correction algorithm 28 that, when executing on the processor 20, uses numerical computations and calculations to correct the measurements of FIG. 2 for the SILC component. The computer program code typically comprises one or more instructions that are resident at various times in memory 22, and that, when read and executed by the processor 20, causes the system 10 to perform the steps necessary to execute steps or elements embodying the various embodiments and aspects of the invention. The instructions in the SILC correction algorithm 28 may follow the logic flow described herein and generally outlined in FIG. 5.

Various program code described herein may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

The system 10 may include a human machine interface that is operatively connected to the processor 20 in a conventional manner. The human machine interface may include output devices, such as alphanumeric displays, a touch screen, and other visual indicators, and input devices and controls, such as an alphanumeric keyboard, a pointing device, keypads, pushbuttons, control knobs, etc., capable of accepting commands or input from the operator and transmitting the entered input to the processor 20.

The system 10 may include the semiconductor parameter analyzer 14 so that the system 10 also controls the testing of the DUT 12, including but not limited to the acquisition of each current-time trace, by the semiconductor parameter analyzer 14.

With renewed reference to FIG. 2, the stress currents of the representative DUT 12 are plotted as a function of measurement time to generate a current-time trace 110 in which the SILC component have been removed in accordance with the SILC correction algorithm 28 to correct the measured stress currents. The SILC correction algorithm includes fitting the current transient data points of the current-time trace 100 into a power-law function for its time-dependence. In the fitting procedure, a time period of the data for the current-time trace 100 is selected. In one embodiment, the beginning time t, for the time period used in the fitting procedure is established as the time in the current-time trace 100 at which the current transient has increased by a fraction of an initial current value. For example, the beginning time t, may be selected as the time in the current-time trace 100 at which the value of the transient current has increased by 50% from an initial current value at the time origin of the current-time trace 100. An ending time $t_f$ is determined as the time at which the measured transient current in the current-time trace 100 exceeds a specified failure current. For example, the ending time $t_f$ may be set as the time at which the current measurement in the current-time trace 100 exceeds 10 microamperes.

The current measurements within the specified time period that begins at the beginning time t, and that ends at the ending time $t_f$ are fitted to an equation, $I_{SILC}=at^b$, and the exponent, b, and the pre-factor, a, are obtained as an output of the curve fitting. The fitting procedure, which is understood by a person having ordinary skill in the art, constructs the indicated mathematical function that has the best fit to the series of data points representing transient currents in the current-time trace 100 over the specified time period. The fit may be established using least-squares fitting, which is mathematical procedure for finding the best fit of a curve to a given set of data points by minimizing the sum of the squares of the offsets of the points from the curve. The equation used in the fitting procedure may be a power function wherein the exponent, b, and the pre-factor, a, are constant real numbers and the time, t, is a variable. The fitted current specified from the equation at any arbitrary time is designated to represent the SILC component contributing to the data points in the current-time trace 100.

The actual current measurements given by the data points in the current-time trace 100 at any given time are compared to the values calculated from the equation. In response to the actual transient current at a particular data point and at a given time in the current-time trace 100 being smaller than the value of $I_{SILC}$ calculated from the equation, the measured current value at that time is replaced by the initial current value at, for example, a measurement time of zero (0) seconds, i.e., the time origin for the time axis in the current-time trace 100. The replacement is made because the measured current value at the data point is dominated by the SILC contribution. In response to the actual measured current being larger than the calculated value of $I_{SILC}$ calculated from the equation, the measured current value at that time is corrected by subtracting the equation-calculated value of $I_{SILC}$ from the measured value of the current. Effectively, this procedure shifts the time of a specified stress current from the originally-measured time to a later corrected time.

The corrected current-time trace 110 reflects the systematic removal of the SILC contribution using the SILC correction algorithm 28 while retaining the breakdown currents evidenced by an improvement in the ability to distinguish fluctuations and spikes associated with breakdown currents of the field-effect transistors in the DUT 12. The SILC correction removes the SILC interference with TDDB data at high temperatures and preserves Poisson area scaling (i.e., the weakest-link failure property) of time-to-failure distributions determined from current-time traces of TDDB data. The SILC correction may be most effective when evaluating TDDB projections for field-effect transistors including gate dielectric layers comprised of a high-k dielectric. As a result, a realistic Weibull slope can be determined that better reflects the TDDB behavior of the DUT 12, which can then provide an accurate and realistic TDDB projection.

While described in the context of gate dielectric layers in field effect transistors, the electrical stress evaluations corrected by the SILC correction algorithm may also be applied to evaluate dielectric layer in capacitors, inter-layer dielectric layers used to isolate conductors from each other in a back-end-of-line interconnection construct, etc. if the effect of SILC on the testing is pronounced.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit", "module", or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 3:
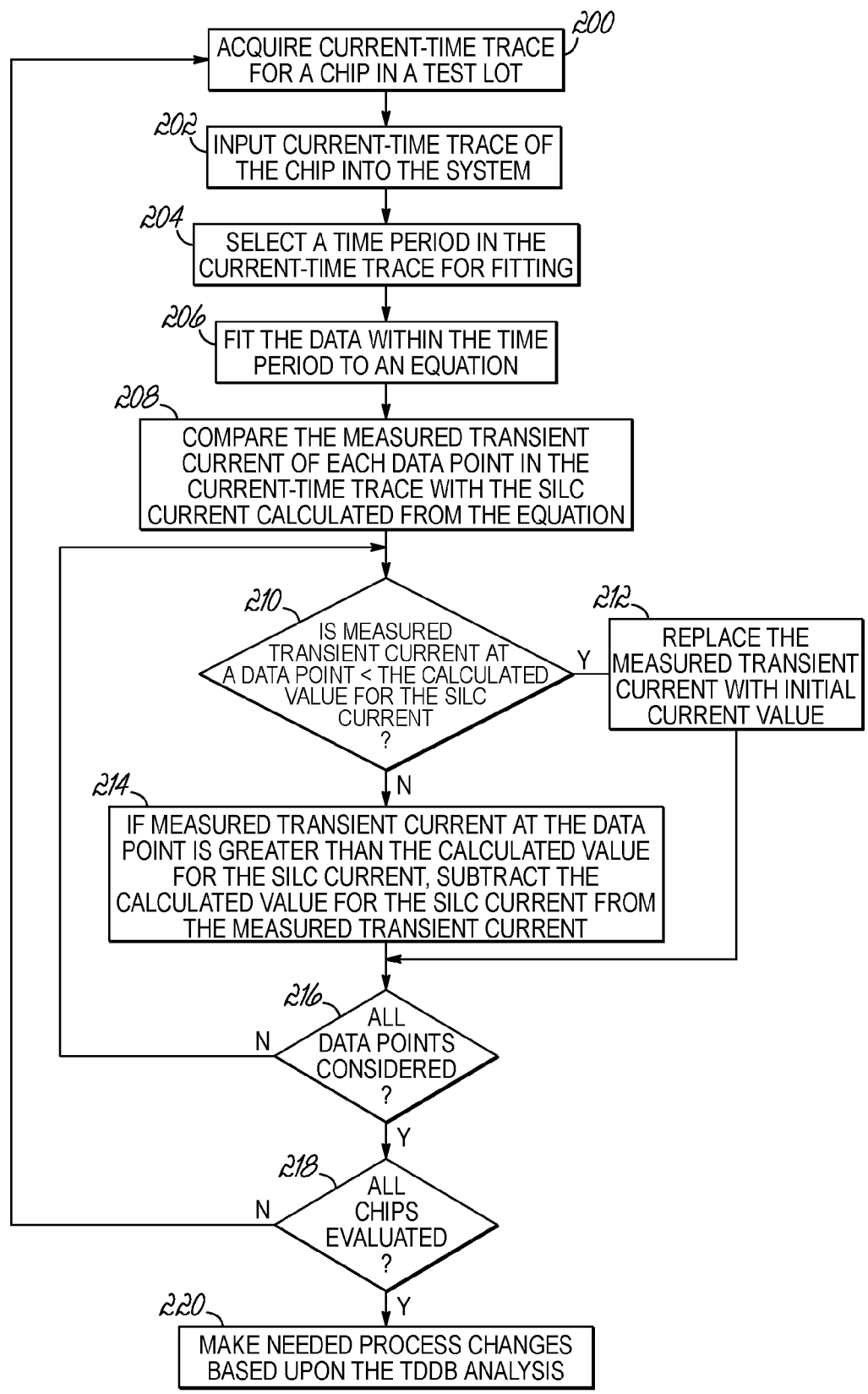
FIG. 3 is flow chart showing a SILC correction algorithm in accordance with an embodiment of the invention.

Referring now to FIG. 3, an electrical stress evaluation is performed on a chip, which is considered to be the DUT 12, using the semiconductor parameter analyzer 14 (FIG. 1) to generate a current-time trace in block 200. The chip undergoing evaluation may be selected from a test lot containing multiple chips. The data contained in the current-time trace for the chip is communicated from the semiconductor parameter analyzer 14 to the system 10 for analysis and, during analysis, is input into the SILC correction algorithm in block 202. In block 204, a time period is selected in the plot of the data in the current-time trace characterizing the chip. Specifically, a beginning time t, and an ending time $t_f$ of the time period are selected on the current-time trace as described hereinabove.

In block 206, the data in the current-time trace over the time period is fit to the equation describing the SILC component. The fitting process may be a least-squares fitting process. If the equation is a power function as in the representative embodiment, then the fitting procedure determines the exponent, b, and the pre-factor, a, for the equation.

In block 208, the actual current measurements ($I_G$) given by the data points in the current-time trace at any given time are compared to the current values ($I_{SILC}$) calculated from the equation describing the SILC component. If the comparison determines in block 210 that the measured transient current at a particular data point at a given time is less than the calculated value of $I_{SILC}$ calculated from the equation, the measured value for transient current at that time is replaced by an initial current value in block 212. If this replacement is made, then block 214 is bypassed and control is transferred forward to block 216. If the actual measured current is greater than the calculated value of $I_{SILC}$ calculated from the equation, the measured value for transient current at that time is corrected by subtracting the equation-calculated value of $I_{SILC}$ from the measured value of the current in block 214. In block 216, a determination is made whether all data points in the current-time trace have been considered. If fewer than all data points in the current-time trace have been considered, control is returned to block 210 for consideration of the next data point in time.

If all data points in the current-time trace have been considered, a determination is made in block 218 whether the current-time traces for all of the chips in the test lot have been corrected to remove the SILC component. If fewer than all chips in the test lot have been considered, then control returns to block 202.

If the current-time traces for all chips in the test lot have been considered and corrected to remove the SILC component, control is transferred to block 220 to project changes to the fabrication process that manufactured the tested chips. For example, possible process changes may be made to the parameters characterizing the gate dielectric layer and its fabrication process, such as changes in layer thickness, process recipe, etc. The correction of the data points in the current-time traces produced by the electrical stress measurements changes the calculations so that they become more accurate and, hence, the changes to the fabrication process based upon the electrical stress measurements are more accurate. The fabrication process changes can be determined by system 10 or by a different system supplied with data from system 10. The process changes may be predicated upon a Weibull plot, which is convenient way of representing statistics of failure events in the DUT 12 as a distribution of oxide breakdown events as a function of electric field. The cumulative failure F is plotted as $-\ln(1-F)$ as a function of a measurement variable such as stress voltage.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Further details and embodiments of the invention will be described in the following examples.

Example 1

Current-time traces were measured for three sets of field-effect transistors (nFETs) connected in parallel and that collectively include gate dielectric layers of three different areas (i.e., 0.608 $\mu m^2$, 0.1216 $\mu m^2$, and 0.0304 $\mu m^2$). All of the field-effect transistors had the same gate length and gate width. The difference in area was created by including different numbers of parallel-connected field-effect transistors in each of the sets (i.e., 100 nFETs, 20 nFETS, and 5 nFETs). The gate dielectric layers were comprised of a hafnium-based high-k dielectric material, namely a dual-layer dielectric film including an $SiO_2$ interfacial layer and a layer of $HfO_2$. The temperature of the gate dielectric layers were held at 125° C. during the current transient measurements and the gate (stress) voltage was 2.2 volts. In each instance, the measured current-time traces were processed to remove the SILC contribution as described herein. The failure current used to determine the ending time, $t_f$, of the analysis time period was 10 microamperes.

Figure 4:
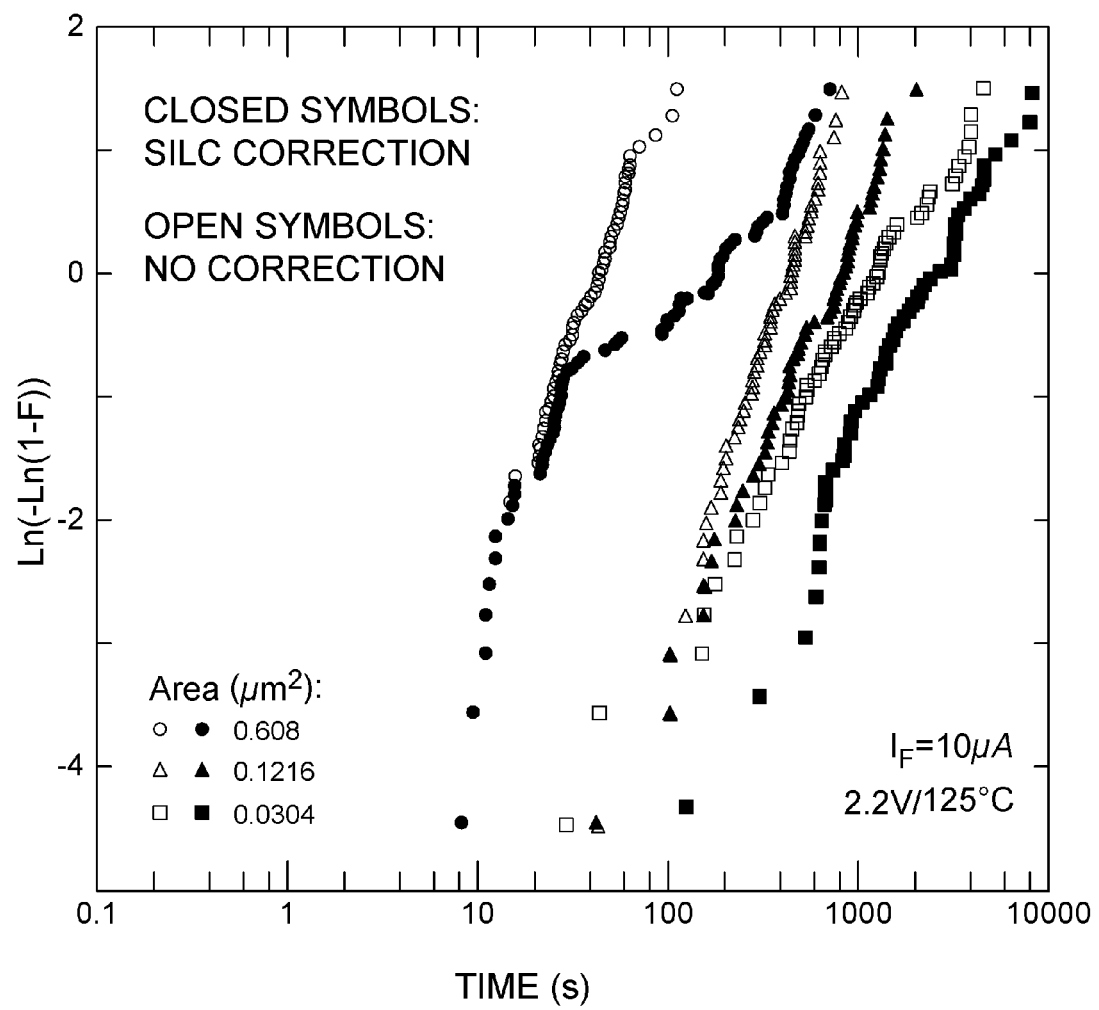
FIG. 4 is graph of a cumulative breakdown distribution, F, represented in a Weibull plot as a function of time to failure before and after SILC correction for three different device areas.

FIG. 4 is a graph of a cumulative breakdown distribution, F, is represented in a Weibull plot as a function of the base-ten logarithm of the time-to-failure before SILC correction and after SILC correction for each of the different device areas. The SILC correction has the largest impact and effect on the breakdown distribution of the field effect transistor of largest area at later times to failure (or equivalently at relatively high percentiles of breakdown). At very short time-to-failures, however, the effectiveness of the SILC correction is reduced as the device area increases because the SILC effect is the dominant contributor to the overall current prior to breakdown events. As the device area decreases, the shift in the perceived time-to-failure with SILC correction and without SILC correction gradually decreases. The slope of each distribution in the Weibull plot may be used for projection of the device TDDB lifetime.

Example 2

Poisson area scaling, $\mathrm{Ln}(-\mathrm{Ln}(1-\mathrm{F1}))-\mathrm{Ln}(-(\mathrm{Ln}(1-\mathrm{F2}))=\mathrm{Ln}(\mathrm{A1}/\mathrm{A2})$, was applied to the Weibull plots of FIG. 4 containing the SILC corrected data. As apparent in the scaled cumulative breakdown distribution in FIG. 5, the distributions for the different device areas merge into a universal distribution, as required by the Poisson area scaling (e.g., the weakest link property) except at relatively short time-to-failures. The merger into the universal distribution validates that the time-to-failure distributions after the SILC correction follow the weakest-link property. The values of Weibull slope derived from the time-to-failure distributions in the Weibull plots are improved by the SILC correction, which leads to more accurate determinations of TDDB projection for a given dielectric layer.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   at least one processor; and
   a memory coupled with the at least one processor, the memory including program code configured to be executed by the processor to evaluate current transients measured during an electrical stress evaluation of a dielectric layer in a semiconductor device, the program code including instructions to:
   fit the measured current transients to an equation representing a time dependence for stress induced leakage currents;
   correct the measured current transients by, for each measured current transient greater than the stress current computed from the equation, subtracting the stress current computed from the equation from the respective measured current transient to define corrected current transients; and
   direct changes to a fabrication process manufacturing the semiconductor device based upon the corrected current transients.

2. The apparatus of claim 1 wherein the instructions to correct the measured current transients based upon stress currents computed from the equation to define corrected current transients comprise instructions to: for each measured current transient smaller than the stress current computed from the equation, replace the respective measured current transient with a given numerical value.

3. The apparatus of claim 2 wherein the measured current transients are contained in a current-time trace, and the given numerical value is the measured current transient at the time origin of the current-time trace.

4. The apparatus of claim 1 wherein the measured current transients are included in a current-time trace, and the instructions to fit the measured current transients to the equation representing the time dependence for the stress induced leakage comprise instructions to:
   select a beginning time and an ending time in the current-time trace for current transients to fit to the equation.

5. The apparatus of claim 4 wherein the instructions to select the beginning time and the ending time in the current-time trace for current transients to fit to the equation comprise instructions to:
   select the ending time in the current-time trace as a measurement time at which the measured current transient equals a specified failure current.

6. The apparatus of claim 4 wherein the instructions to select the beginning time and the ending time in the current-time trace for current transients to fit to the equation comprise instructions to:
   select the beginning time in the current-time trace as a measurement time at which the measured current transient rises to a given fraction above the measured transient at the time origin.

7. The apparatus of claim 1 wherein the equation is a power-law function, and the instructions to fit the measured current transients to the equation representing the time dependence for the stress induced leakage comprise instructions to: determine constant real numbers for an exponent and a pre-factor for the power-law function when the measured current transients are fit to the power-law function.

8. The apparatus of claim 7 wherein the measured current transients are fit to the power-law function using least-squares fitting.

9. The apparatus of claim 1 further comprising:
   a semiconductor parameter analyzer configured to measure the current transients, the semiconductor parameter analyzer configured to communicate data representing the current transients to the processor.

10. The apparatus of claim 9 wherein the semiconductor parameter analyzer is configured to measure the current transients as current-time traces.

11. The apparatus of claim 1, where the directed change is a change in a dielectric layer thickness.

12. The apparatus of claim 1, where the directed change is a change in a dielectric layer material recipe.

13. A computer program product for evaluating current transients measured during an electrical stress evaluation of a dielectric layer in a semiconductor device, the computer program product comprising:
    a non-transient computer readable storage medium; and
    computer readable program code embodied in the non-transient computer readable storage medium, the computer readable program code comprising instructions to:
    fit the measured current transients to an equation representing a time dependence for stress induced leakage currents;
    correct the measured current transients by, for each measured current transient greater than the stress current computed from the equation, subtracting the stress current computed from the equation from the respective measured current transient to define corrected current transients; and
    direct changes to a fabrication process manufacturing the semiconductor device based upon the corrected current transients.

14. The computer program product of claim 13 wherein the instructions to correct the measured current transients based upon stress currents computed from the equation to define corrected current transients comprise instructions to: for each measured current transient smaller than the stress current computed from the equation, replace the respective measured current transient with a given numerical value.

15. The computer program product of claim 14 wherein the measured current transients are contained in a current-time trace, and the given numerical value is the measured current transient at the time origin of the current-time trace.

16. The computer program product of claim 13 wherein the measured current transients are included in a current-time trace, and the instructions to fit the measured current transients to the equation representing the time dependence for the stress induced leakage comprise instructions to: select a beginning time and an ending time in the current-time trace for current transients to fit to the equation.

17. The computer program product of claim 16 wherein the instructions to select the beginning time and the ending time in the current-time trace for current transients to fit to the equation comprise instructions to: select the ending time in the current-time trace as a measurement time at which the measured current transient equals a specified failure current.

18. The computer program product of claim 16 wherein the instructions to select the beginning time and the ending time in the current-time trace for current transients to fit to the equation comprise instructions to: select the beginning time in the current-time trace as a measurement time at which the measured current transient rises to a given fraction above the measured transient at the time origin.

19. The computer program product of claim 13 wherein the equation is a power-law function, and the instructions to fit the measured current transients to the equation representing the time dependence for the stress induced leakage comprise instructions to: determine constant real numbers for an exponent and a pre-factor for the power-law function when the measured current transients are fit to the power-law function.

20. The computer program product of claim 19 wherein the measured current transients are fit to the power-law function using least-squares fitting.

21. The computer program product of claim 13, where the directed change is a change in a dielectric layer thickness.

22. The computer program product of claim 13, where the directed change is a change in a dielectric layer material recipe.

* * * * *